United States Patent
Okumura et al.

(10) Patent No.: US 7,858,155 B2
(45) Date of Patent: Dec. 28, 2010

(54) PLASMA PROCESSING METHOD AND PLASMA PROCESSING APPARATUS

(75) Inventors: Tomohiro Okumura, Osaka (JP); Yuichiro Sasaki, Tokyo (JP); Katsumi Okashita, Tokyo (JP); Cheng-Guo Jin, Osaka (JP); Satoshi Maeshima, Hyogo (JP); Hiroyuki Ito, Chiba (JP); Ichiro Nakayama, Osaka (JP); Bunji Mizuno, Nara (JP)

(73) Assignee: Panasonic Corporation, Osaka (JP)

( * ) Notice: Subject to any disclaimer, the term of this patent is extended or adjusted under 35 U.S.C. 154(b) by 539 days.

(21) Appl. No.: 11/666,773

(22) PCT Filed: Oct. 27, 2005

(86) PCT No.: PCT/JP2005/019778

§ 371 (c)(1),
(2), (4) Date: May 7, 2008

(87) PCT Pub. No.: WO2006/049076

PCT Pub. Date: May 11, 2006

(65) Prior Publication Data

US 2008/0258082 A1    Oct. 23, 2008

(30) Foreign Application Priority Data

Nov. 2, 2004    (JP)    ............................... 2004-319352

(51) Int. Cl.
*A61N 5/00*    (2006.01)
*G21G 5/00*    (2006.01)

(52) U.S. Cl. .................. 427/523; 438/710; 438/714; 438/729; 438/185; 438/434; 438/151; 438/300; 216/62; 118/723

(58) Field of Classification Search ............... 250/492.3; 438/710, 714, 729, 424, 185, 434, 151, 300; 216/62; 427/523; 118/723
See application file for complete search history.

(56) References Cited

U.S. PATENT DOCUMENTS 4,912,065 A    3/1990    Mizuno et al.
(Continued)

FOREIGN PATENT DOCUMENTS

| JP | 9-115851 A | 5/1997 |
|---|---|---|
| JP | 2003-515945 A | 5/2003 |
| JP | 2004-79820 A | 3/2004 |

OTHER PUBLICATIONS

Chinese Office Action, with English Translation, issued in Chinese Patent Application No. CN 200580037487.X, dated Jul. 11, 2008.
(Continued)

*Primary Examiner*—Jack I Berman
*Assistant Examiner*—Meenakshi S Sahu
(74) *Attorney, Agent, or Firm*—McDermott Will & Emery LLP

(57) ABSTRACT

It is intended to provide a plasma processing method and apparatus capable of increasing the uniformity of amorphyzation processing.

A prescribed gas is introduced into a vacuum container 1 from a gas supply apparatus 2 through a gas inlet 11 while being exhausted by a turbomolecular pump 3 as an exhaust apparatus through an exhaust hole 12. The pressure in the vacuum container 1 is kept at a prescribed value by a pressure regulating valve 4. High-frequency electric power of 13.56 MHz is supplied from a high-frequency power source 5 to a coil 8 disposed close to a dielectric window 7 which is opposed to a sample electrode 6, whereby induction-coupled plasma is generated in the vacuum container 1. A high-frequency power source 10 for supplying high-frequency electric power to the sample electrode 6 is provided and functions as a voltage source for controlling the potential of the sample electrode 6. A surface crystal layer of a silicon wafer 9 was rendered amorphous successfully by improving the structure of the sample-electrode 6.

33 Claims, 7 Drawing Sheets

U.S. PATENT DOCUMENTS

| | | | |
|---|---|---|---|
| 5,711,812 A | | 1/1998 | Chapek et al. |
| 2001/0042827 A1* | | 11/2001 | Fang et al. .................. 250/283 |
| 2002/0030167 A1 | | 3/2002 | Liebert et al. |
| 2008/0182416 A1* | | 7/2008 | Collins et al. ............... 438/710 |
| 2008/0182417 A1* | | 7/2008 | Collins et al. ............... 438/710 |
| 2008/0182418 A1* | | 7/2008 | Collins et al. ............... 438/710 |
| 2008/0289576 A1* | | 11/2008 | Lee et al. .................... 118/723 |

OTHER PUBLICATIONS

Y. Sasaki et al., "$B_2H_6$ Plasma Doping with "In-situ He Pre-amorphization,"" 2004 Symposium on VLSI Technology, Digest of Technical Papers, The IEEE Electron Devices Society, The Japan Society of Applied Physics, pp. 180-181.

* cited by examiner

1: VACUUM CONTAINER
2: GAS SUPPLY APPARATUS
3: TURBOMOLECULAR PUMP
4: PRESSURE REGULATING VALUE
5: HIGH-FREQUENCY POWER SOURCE
6: SAMPLE ELECTRODE
7: DIELECTRIC WINDOW
8: COIL
9: WAFER
10: HIGH-FREQUENCY POWER SOURCE
11: GAS INLET
12: EXHAUST HOLE

PLASMA PROCESSING METHOD AND PLASMA PROCESSING APPARATUS

RELATED APPLICATIONS

This application is the U.S. National Phase under 35 U.S.C. §371 of International Application No. PCT/JP2005/019778, filed on Oct. 27, 2005, which in turn claims the benefit of Japanese Application No. 2004-319352, filed on Nov. 2, 2004, the disclosures of which Applications are incorporated by reference herein.

TECHNICAL FIELD

The present invention relates to a plasma processing method and a plasma processing apparatus. In particular, the invention relates to a method and apparatus for supplying plasma to a surface layer of a sample uniformly.

BACKGROUND ART

Among known techniques for introducing an impurity into a surface layer of a solid sample is a plasma doping method in which an impurity is ionized and introduced into a solid at low energy (refer to Patent document 1, for example).

FIG. 12 shows a general configuration of a plasma processing apparatus which is used for a plasma doping method as a conventional impurity introducing method disclosed in the above-mentioned Patent document 1. As shown in FIG. 12, a sample electrode 43 to be mounted with a sample 42 which is a silicon wafer is provided in a vacuum container 41. A gas supply apparatus 44 for supplying a doping source gas containing a desired element such as $B_2H_6$ to the inside of the vacuum container 41 and a pump 45 for reducing the pressure in the vacuum container 41 are provided, whereby the pressure in the vacuum container 41 can be kept at a prescribed value. Microwaves are radiated from a microwave waveguide 46 into the vacuum container 41 via a quartz plate 47 as a dielectric window. The microwaves interact with a DC magnetic field formed by an electromagnet 48, whereby microwave plasma with a magnetic field (electron cyclotron resonance plasma) 49 is formed in the vacuum container 41. A high-frequency power source 51 is connected to the sample electrode 43 via a capacitor 50 so as to enable control of the potential of the sample electrode 43. A gas that is supplied form the gas supply apparatus 44 is introduced into the vacuum container 41 through a gas inlet 52 and exhausted into the pump 45 through an exhaust hole 53.

In the above-configured plasma processing apparatus, a doping source gas such as $B_2H_6$ that is introduced through the gas inlet 52 is converted into plasma 49 by a plasma generating means consisting of the microwave waveguide 46 and the electromagnet 48 and boron ions in the plasma 49 are supplied to the surface of a sample 42 by means of the high-frequency power source 51.

Incidentally, in general, gases containing an impurity that is rendered electrically active when supplied to a sample such as a silicon wafer, such as a doping source gas $B_2H_6$, have a problem that they are very dangerous; for example, they are harmful to human bodies or high in reactivity.

In plasma doping methods, all substances contained in a doping source gas are introduced into a sample. In the case of a doping source gas $B_2H_6$, for example, hydrogen is also introduced into a sample though only boron is an impurity that is effective when introduced into the sample.

Introduction of hydrogen into a sample raises a problem that lattice defects occur in the sample in subsequent heat treatment for epitaxial growth, for example.

In view of the above, the following method has been proposed (refer to Patent document 2, for example). An impurity solid containing an impurity which is rendered electrically active when introduced into a sample is disposed in a vacuum container. Plasma of a rare gas is generated in the vacuum container and an impurity solid is bombarded with ions of the inert gas, whereby the impurity is separated from the impurity solid and supplied to the sample. FIG. 13 shows a general configuration of a plasma doping apparatus which is used in a plasma doping method as the conventional impurity introducing method disclosed in Patent document 2. As shown in FIG. 13, a sample electrode 43 to be mounted with a sample 42 which is a silicon wafer is provided in a vacuum container 41. A gas supply apparatus 44 for supplying an inert gas to the inside of the vacuum container 41 and a pump 45 for reducing the pressure in the vacuum container 41 are provided, whereby the pressure in the vacuum container 41 can be kept at a prescribed value. Microwaves are radiated from a microwave waveguide 46 into the vacuum container 41 via a quartz plate 47 as a dielectric window. The microwaves interact with a DC magnetic field formed by an electromagnet 48, whereby microwave plasma with a magnetic field (electron cyclotron resonance plasma) 49 is formed in the vacuum container 41. A high-frequency power source 51 is connected to the sample electrode 43 via a capacitor 50, whereby the potential of the sample electrode 43 can be controlled. An impurity solid 54 containing an impurity element such as boron is mounted on a solid holding stage 55, whose potential is controlled by a high-frequency power source 57 connected to it via a capacitor 56. A gas that is supplied form the gas supply apparatus 44 is introduced into the vacuum container 41 through a gas inlet 52 and exhausted into the pump 45 through an exhaust hole 53.

In the above-configured plasma doping apparatus, an inert gas such as argon (Ar) introduced through the gas inlet 11 is converted into plasma by a plasma generating means consisting of the microwave waveguide 46 and the electromagnet 48, and part of impurity element atoms that have been expelled from the impurity solid 54 by the bombardment into the plasma are ionized and introduced into a surface layer of a sample 42.

Usually, a silicon oxide film as a gate oxide film is formed on the surface of the sample 42. A conductive layer for formation of gate electrodes is formed on the gate oxide film by CVD or the like and then patterned into gate electrode patterns. The sample 42 on which the gate electrodes have been formed in this manner is set in the plasma doping apparatus, and source and drain regions are formed by introducing an impurity by the above-described method in a self-aligned manner using the gate electrodes as a mask. MOS transistors are thus obtained. However, activation processing needs to be performed after the introduction of the impurity by the plasma doping. The activation processing is processing of rendering the crystal in an active state by heating the sample 42 by flash lamp annealing, laser annealing, or the like. A shallow activation layer can be obtained by heating a very thin impurity-introduced layer effectively. To heat a very thin impurity-introduced layer effectively, processing for increasing, before introduction of the impurity, the absorbance, for light emitted from a light source such as a laser or a lamp, of a very thin layer into which to introduce the impurity is performed. This processing, which is called "pre-amorphyzation," is as follows. In a plasma processing apparatus which is similar in configuration to the above-described plasma doping apparatus, plasma of a He gas, for example, is generated and generated He ions, for example, are caused to be accelerated toward and collide with a substrate by a bias voltage, whereby the crystal structure of a substrate surface layer is destroyed to attain amorphyzation. This technique has already been proposed by the inventors of this application (refer to Non-patent document 1, for example).

Patent document 1: U.S. Pat. No. 4,912,065
Patent document 2: JP-A-09-115851
Non-patent document 1: Y. Sasaki et al., "$B_2H_6$ Plasma Doping with In-situ He Pre-amorphyzation," 2004 Symposia on VLSI Technology and Circuits.

DISCLOSURE OF THE INVENTION

Problems to Be Solved by the Invention

Incidentally, with the recent miniaturization and the increase in integration density of semiconductor devices, it is necessary to form shallow and very fine impurity-introduced regions. This requires extremely accurate depth and impurity concentration controls. In these circumstances, conventional methods have a problem that it is difficult to form an impurity-introduced layer that is uniform in a sample or, in a current situation that the wafer diameter is increasing, in a wafer surface. This is because of not only difficulty in forming impurity-containing plasma with a uniform distribution in a wafer surface but also a high degree of difficulty in amorphyzing a surface layer of a sample with high accuracy and a uniform depth distribution in the above-described pre-amorphyzation processing.

FIG. 10 shows a result of a measurement of the thickness of an amorphous layer produced by amorphyzing a 200-mm-diameter silicon wafer by the conventional plasma doping apparatus of FIG. 12. The x-axis is taken in the top-to-bottom direction in FIG. 12. As seen from FIG. 10, the thickness of the amorphous layer is extremely high in a peripheral portion of the wafer (sample), in particular, in an area within 10 mm of the outer perimeter of the wafer. The thickness of the amorphous layer is a thickness of an amorphous silicon layer of a single crystal silicon wafer measured by an elliptometry method.

This phenomenon is not limited to the thickness of an amorphous layer. It has been found that high impurity concentrations likewise occur in an area close to the outer perimeter of a wafer when plasma doping is performed by supplying impurity plasma to the surface of an amorphous layer after formation of the amorphous layer.

It is considered that each of the above phenomena occurs because an edge effect causes plasma concentration in a peripheral area of a wafer, whereby energy concentration occurs in the vicinity of the outer perimeter of a wafer and plasma reaches the wafer surface in a state that the plasma concentration is high.

The present invention has been made in view of the above circumstances, and an object of the invention is therefore to increase the uniformity of plasma processing.

Another object of the invention is to provide an amorphyzing method and apparatus capable of increasing the uniformity of amorphyzation processing.

A further object of the invention is to provide an impurity introducing method and apparatus capable of increasing the sample surface uniformity of the impurity introduction amount.

Means for Solving the Problems

A plasma processing method according to the invention is characterized in that plasma is applied to a surface of a sample while being adjusted so that thickness of an ion sheath is made uniform on the surface of the sample.

With this constitution, the incidence energy of plasma incident on the sample is made uniform in the entire area including the area corresponding to the portion, close to the outer perimeter, of the sample, which makes it possible to increase the uniformity of the plasma processing. In particular, when it is necessary to perform high-precision processing on very fine regions in amorphyzation processing, doping processing, or the like in which not only the dimensions in the surface but also the depth from the surface needs to be taken into consideration, this method enables not only control of the in-plane uniformity but also control in the three dimensions including the depth.

The workings of this constitution will be described below in detail.

When a conductor having a potential $V_P$ is inserted in plasma having a plasma potential $V_S$, a negative electric field is formed around the conductor if $V_P<V_S$. Since ions are attracted and electrons are repelled, a condition (ion concentration)>(electron concentration) is established and a charge layer consisting of only ions is formed. Conversely, if $V_P>V_S$, a charge layer consisting of only electrons is formed.

This charge layer is called "sheath." A sheath consisting of electrons is called "electron sheath" and a sheath consisting of ions is called "ion sheath."

On the other hand, when an insulator, instead of a conductor, is inserted in plasma, the number of electrons that come flying per unit time should be equal to that of ions that come flying per unit time because no DC current flows between the insulator and the plasma. However, since in general the speeds of electrons are much higher than those of ions, more electrons reach the surface of the insulator than ions. Therefore, excess electrons on the surface form a negative electric field in the vicinity of the surface and charging progresses until the electron current and the ion current become identical. A negative potential occurring in this manner is called "floating potential." In this case, an ion sheath is formed on the surface.

A sheath voltage drop $V_{SH}$ can be increased (controlled) by applying high-frequency power to the electrode. Since the mobility of electrons is much higher than that of ions, a large electron current flows in if the application voltage is positive whereas a small ion current flows in if the application voltage is negative. Since the electrode (or substrate surface) is in a floating state in a DC sense, a steady state is established when the net current (the DC component of the current) becomes zero. Therefore, the electrode (or substrate surface) is self-biased at a negative potential. In general, the self-bias voltage is represented by $V_{DC}$ (direct-current voltage) and the difference $V_{PP}$ between the instantaneous maximum and minimum values of the high-frequency voltage is represented by $V_{PP}$ (peak-to-peak voltage). If the high-frequency power applied to the electrode is increased, $V_{DC}$ and $V_{PP}$ are increased.

For example, in the invention, the capacitance per unit area between a substrate and a pedestal is set a little larger than that between plasma and the pedestal via a dielectric ring, whereby the difference between the ion sheath thickness in the area corresponding to the substrate central portion and that in the area corresponding to the substrate peripheral portion is reduced.

The uniformity of pre-amorphyzation processing can be increased by decreasing the difference between the capacitance per unit area between the substrate and the pedestal and the capacitance between the plasma and the pedestal via the dielectric ring in the above manner.

With the above constitution, to make physical-phenomenon-dominated processing uniform, an otherwise excessively high ion concentration in the area corresponding to the substrate peripheral portion is reduced or the thickness of an ion sheath in the area corresponding to the substrate peripheral portion is made equal to that in the area corresponding to the other area of the substrate by using a focus ring (or dielectric ring).

The plasma processing method according to the invention includes a method for amorphyzing a surface layer of the sample.

The amorphyzation which introduces plasma to a prescribed depth from the sample surface and thereby amorphyzes plasma-introduced regions can control the introduction depth of an impurity with high accuracy if performed before or during doping.

The plasma processing method according to the invention includes a method for introducing an impurity into a surface layer of the sample.

The introduction of an impurity, that is, the doping processing, depends on, in particular, the in-plane distribution in the sample and the energy state of the impurity at that position. Therefore, uniform processing can be attained with high accuracy.

The plasma processing method according to the invention includes a method comprising the steps of mounting the sample on a sample electrode disposed in a vacuum container, exhausting the vacuum container while supplying a source gas to inside the vacuum container, and generating plasma in the vacuum container by supplying high-frequency power to a plasma source; and applying plasma to the surface of the sample in a state that a conductor ring having a surface that is approximately the same in height as the surface of the sample is disposed so as to surround an outer perimeter of the sample.

Capable of avoiding concentration of plasma on a peripheral portion of the sample, this constitution can attain a uniform in-plane distribution in the surface of the sample.

For example, the invention provides an amorphyzing method having the steps of mounting a sample on a sample electrode disposed in a vacuum container, exhausting the vacuum container while supplying a gas to inside the vacuum container by a gas supply apparatus and controlling pressure in the vacuum container at a prescribed value, generating plasma in the vacuum container by supplying high-frequency power to a plasma source; and amorphyzing a surface crystal layer of a sample by supplying a voltage to the sample electrode, characterized in that the amorphyzation is performed in a state that a conductor ring having a surface that is approximately the same in height as the surface of the sample is disposed outside an outer perimeter of the sample.

According to this constitution, the distortion of equipotential lines of a sheath layer in the area corresponding to the portion, close to the outer perimeter, of the sample is reduced and the incidence energy of ions incident on the sample is thereby made uniform in the entire area including the area corresponding to the portion, close to the outer perimeter, of the sample. The uniformity of the amorphyzation processing can thus be increased.

The plasma processing method according to the invention includes a method in which a distance between the outer perimeter of the sample and an inner perimeter of the conductor ring is in a range of 1 mm to 10 mm.

This constitution makes it possible to secure both of a sufficient margin for transport of a substrate and high uniformity of processing.

The plasma processing method according to the invention includes a method in which a difference in height between the surface of the sample and a surface of the conductor ring is in a range of 0.001 mm to 1 mm.

This constitution makes it possible to attain even higher uniformity of processing.

The plasma processing method according to the invention includes a method in which a voltage is applied to a pedestal in a state that the sample electrode has a layered structure in which a first dielectric layer, an electrostatic chuck electrode, a second dielectric layer, and the pedestal are arranged in this order from the side that is closer to the sample, that the first dielectric layer, the electrostatic chuck electrode, and the second dielectric layer project from the pedestal, and that a third dielectric layer is disposed between the conductor ring and the pedestal. This case includes a method in which $Ca=1/(d_1/\in_1+d_2/\in_2)$ is larger than or equal to 0.5 times $Cb=\in_3/d_3$ and smaller than or equal to 2 times $Cb$, where $\in_1$ and $d_1$ are relative permittivity and thickness of the first dielectric layer, $\in_2$ and $d_2$ are relative permittivity and thickness of the second dielectric layer, and $\in_3$ and $d_3$ are relative permittivity and thickness of the third dielectric layer.

With this constitution, the capacitance between the pedestal and the substrate can be made approximately equal to that between the pedestal and the conductor ring. It is desirable that the two capacitances be approximately identical. If the former is smaller than 0.5 times the latter, an ion sheath is too thick over the surface of the conductor ring and the electric field strength of the sheath in the area corresponding to the edge portion of the sample is lower than in the area corresponding to the central portion of the sample. As a result, the processing rate may become low in the edge portion of the sample. On the other hand, if the former is larger than 2 times the latter, an ion sheath is too thin over the surface of the conductor ring and the electric field strength of the sheath in the area corresponding to the edge portion of the sample is higher than in the area corresponding to the central portion of the sample. As a result, the processing rate may become high in the edge portion of the sample. The constitution that satisfies the above condition makes it possible to satisfy the conditions for uniform processing though the condition may vary a little depending on the permittivity and the thickness of the sample.

The plasma processing method according to also includes a method in which a voltage is applied to an electrostatic chuck electrode in a state that the sample electrode has a layered structure in which a first dielectric layer, the electrostatic chuck electrode, a second dielectric layer, and a pedestal are arranged in this order from the side that is closer to the sample, that the first dielectric layer, the electrostatic chuck electrode, and the second dielectric layer project from the pedestal, and that a third dielectric layer is disposed between the conductor ring and the pedestal. This case includes a method in which $Cc=\in_1/d_1$ is larger than or equal to 0.5 times $Cd=1/\{(d_2 \times S_2)/(\in_2 \times S_1)+d_3/\in_3\}$ and smaller than or equal to 2 times $Cd$, where $\in_1$ and $d_1$ are relative permittivity and thickness of the first dielectric layer, $\in_2$ and $d_2$ are relative permittivity and thickness of the second dielectric layer, $\in_3$ and $d_3$ are relative permittivity and thickness of the third dielectric layer, $S_1$ is an area of a surface, exposed to the plasma, of the sample, and $S_2$ is an area of a surface, exposed to the plasma, of the conductor ring.

Also with this constitution, the capacitance between the pedestal and the substrate can be made approximately equal to that between the pedestal and the conductor ring. It is desirable that the two capacitances be approximately identical. If the former is smaller than 0.5 times the latter, an ion sheath is too thick over the surface of the conductor ring and the electric field strength of the sheath in the area corresponding to the edge portion of the sample is lower than in the area corresponding to the central portion of the sample. As a result, the processing rate may become low in the edge portion of the sample. On the other hand, if the former is larger than 2 times the latter, an ion sheath is too thin over the surface of the conductor ring and the electric field strength of the sheath in the area corresponding to the edge portion of the sample is higher than in the area corresponding to the central portion of the sample. As a result, the processing rate may become high in the edge portion of the sample. The constitution that satisfies the above condition makes it possible to satisfy the conditions for uniform processing though the condition may vary a little depending on the permittivity and the thickness of the sample.

The plasma processing method according to the invention includes a method in which plasma processing is performed in a state that a focus ring having a surface that is higher than the surface of the sample by 1 mm or more is disposed outside an outer perimeter of the sample.

According to this constitution, the distortion of equipotential lines of a sheath layer is reduced by concentrating plasma on the focus ring in the area corresponding to the portion, close to the outer perimeter, of the sample and the incidence energy of ions or plasma incident on the sample is thereby made uniform in the entire area including the area corresponding to the portion, close to the outer perimeter, of the sample. The uniformity of the amorphyzation processing can thus be increased.

The plasma processing method according to the invention includes a method in which a distance between the outer perimeter of the sample and an inner perimeter of the focus ring is in a range of 1 mm to 10 mm.

This constitution makes it possible to secure both of a sufficient margin for transport of a substrate and high uniformity of processing. If the distance is shorter than 1 mm, the transport of a substrate is difficult. If the distance is longer than 10 mm, it is difficult to obtain the effect of reducing the distortion of equipotential lines.

The plasma processing method according to the invention includes a method in which a difference in height between the surface of the sample and a surface of the focus ring is in a range of 1 mm to 15 mm.

This constitution makes it possible to attain even higher uniformity of processing.

The plasma processing method according to includes a method comprising the steps of mounting the sample on a tray disposed in a vacuum container and having a step inside which the sample is mounted, exhausting the vacuum container while supplying a source gas to inside the vacuum container, and generating plasma in the vacuum container by supplying high-frequency power to a plasma source; and applying plasma to the surface of the sample while making an adjustment so that a surface of a portion, outside the recess, of the tray is approximately the same in height as the surface of the sample.

According to this constitution, the distortion of equipotential lines of a sheath layer in the area corresponding to the portion, close to the outer perimeter, of the sample is reduced and the incidence energy of ions incident on the sample is thereby made uniform in the entire area including the area corresponding to the portion, close to the outer perimeter, of the sample. The uniformity of the amorphyzation processing can thus be increased.

The plasma processing method according to the invention includes a method in which a distance between the outer perimeter of the sample and the step is in a range of 1 mm to 10 mm.

This constitution makes it possible to secure both of a sufficient margin for transport of a substrate and high uniformity of processing.

The plasma processing method according to the invention includes a method in which a difference in height between the surface of the sample and a surface of the portion, outside the step, of the tray is in a range of 0.001 mm to 1 mm.

This constitution makes it possible to attain even higher uniformity of processing.

The plasma processing method according to the invention includes a method in which the sample is a silicon wafer and the tray is made of silicon.

This constitution can minimize of the substrate pollution.

The plasma processing method according to the invention includes a method in which the plasma processing is performed in a state that the tray is pressed against the sample electrode.

This constitution enables efficient heat dissipation from the substrate via the sample electrode and thereby makes it possible to control the substrate temperature more precisely.

The plasma processing method according to the invention includes a method in which a step of generating plasma and a step in which the plasma generation is suspended and pressure in the vacuum container is set higher than in the step of generating plasma are performed alternately and repeatedly.

With this constitution, heat that has been stored in the substrate in the step of generating plasma is allowed to escape to the sample electrode side in the step in which the plasma generation is suspended and the pressure in the vacuum container is set higher than in the step of generating plasma. This in turn makes it possible to control the substrate temperature more precisely.

In this case, it is even desirable that the pressure in the vacuum container is in a range of 100 Pa to 1,000 Pa in the step in which the plasma generation is suspended and the pressure in the vacuum container is set higher than in the step of generating plasma.

This constitution makes it possible to control the substrate temperature more precisely.

The invention provides a plasma processing apparatus having a vacuum container; a sample electrode disposed in the vacuum container and to be mounted with a sample; a gas supply apparatus for supplying a gas to inside the vacuum container; an exhaust apparatus for exhausting the vacuum container; a pressure control device for controlling pressure in the vacuum container; a plasma source; a high-frequency power source for supplying high-frequency power to the plasma source; and a voltage source for applying a voltage to the sample electrode, characterized by comprising an auxiliary member disposed around the sample electrode so that plasma is applied to a surface of a sample while being adjusted so as to have a uniform energy state on the surface of the sample.

The plasma processing apparatus according to the invention includes an apparatus in which the plasma is adjusted so as to amorphyze a surface layer of the sample.

The plasma processing apparatus according to the invention includes an apparatus in which the plasma is adjusted so as to introduce an impurity into a surface layer of the sample.

The plasma processing apparatus according to the invention includes an apparatus in which the sample electrode has a projecting portion to be mounted with the sample, and the auxiliary member is a conductor ring disposed so as to surround an outer perimeter of the sample and to have a surface that is approximately the same in height as the surface of the sample.

According to this configuration, the distortion of equipotential lines of a sheath layer in the area corresponding to the portion, close to the outer perimeter, of the sample is reduced and the incidence energy of ions incident on the sample is thereby made uniform in the entire area including the area corresponding to the portion, close to the outer perimeter, of the sample. The uniformity of the amorphyzation processing can thus be increased.

The plasma processing apparatus according to the invention includes an apparatus in which a distance between the outer perimeter of the sample and an inner perimeter of the conductor ring is in a range of 2 mm to 11 mm.

This configuration makes it possible to secure both of a sufficient margin for transport of a substrate and high uniformity of processing.

The plasma processing apparatus according to the invention includes an apparatus in which a difference in height between the surface of the sample and a surface of the conductor ring is in a range of 0.001 mm to 2 mm.

This configuration makes it possible to attain even higher uniformity of processing.

The plasma processing apparatus according to the invention includes an apparatus in which a voltage is applied to a pedestal in a state that the sample electrode has a layered structure in which a first dielectric layer, an electrostatic chuck electrode, a second dielectric layer, and the pedestal are arranged in this order from the side that is closer to the sample, that the first dielectric layer, the electrostatic chuck electrode, and the second dielectric layer project from the pedestal, and that a third dielectric layer is disposed between the conductor ring and the pedestal.

The plasma processing apparatus according to the invention includes an apparatus in which $Ca=1/(d1/\in1+d2/\in2)$ is larger than or equal to 0.5 times $Cb=\in3/d3$ and smaller than or equal to 2 times Cb, where $\in1$ and d1 are relative permittivity and thickness of the first dielectric layer, $\in2$ and d2 are relative permittivity and thickness of the second dielectric layer, and $\in3$ and d3 are relative permittivity and thickness of the third dielectric layer.

This configuration makes it possible to increase the uniformity of processing while controlling the substrate temperature precisely.

The plasma processing apparatus according to the invention includes an apparatus in which a voltage is applied to an electrostatic chuck electrode in a state that the sample electrode has a layered structure in which a first dielectric layer, the electrostatic chuck electrode, a second dielectric layer, and a pedestal are arranged in this order from the side that is closer to the sample, that the first dielectric layer, the electrostatic chuck electrode, and the second dielectric layer project from the pedestal, and that a third dielectric layer is disposed between the conductor ring and the pedestal.

The plasma processing apparatus according to the invention includes an apparatus in which $Cc=\in1/d1$ is larger than or equal to 0.5 times $Cd=1/\{(d2\times S2)/(\in2\times S1)+d3/\in3\}$ and smaller than or equal to 2 times Cd, where $\in1$ and d1 are relative permittivity and thickness of the first dielectric layer, $\in2$ and d2 are relative permittivity and thickness of the second dielectric layer, and $\in3$ and d3 are relative permittivity and thickness of the third dielectric layer.

This configuration makes it possible to increase the uniformity of processing while controlling the substrate temperature precisely.

The plasma processing apparatus according to the invention includes an apparatus in which the sample electrode has a projecting portion, and a focus ring is disposed so as to have a surface that is higher than the surface of the projecting portion of the sample electrode by 1 mm or more.

According to this configuration, the distortion of equipotential lines of a sheath layer in the area corresponding to the portion, close to the outer perimeter, of the sample is reduced and the incidence energy of plasma or ions incident on the sample is thereby made uniform in the entire area including the area corresponding to the portion, close to the outer perimeter, of the sample. The uniformity of the amorphyzation processing can thus be increased.

The plasma processing apparatus according to the invention includes an apparatus in which a distance between the outer perimeter of the sample and an inner perimeter of the focus ring is in a range of 2 mm to 11 mm.

This configuration makes it possible to secure both of a sufficient margin for transport of a substrate and high uniformity of processing.

The plasma processing apparatus according to the invention includes an apparatus in which a difference in height between the surface of the sample and a surface of the focus ring is in a range of 2 mm to 16 mm.

This configuration makes it possible to attain even higher uniformity of processing.

Advantages of the Invention

As described above, the plasma processing method and the plasma processing apparatus according to the invention can increase the uniformity of processing and thereby realize plasma processing that is high in accuracy and reliability.

In particular, they can increase the uniformity of amorphyzation processing in forming an impurity-introduced layer.

Furthermore, they make it possible to control, with high accuracy, the amount of a supplied impurity also in plasma doping using impurity plasma.

Figure 1:
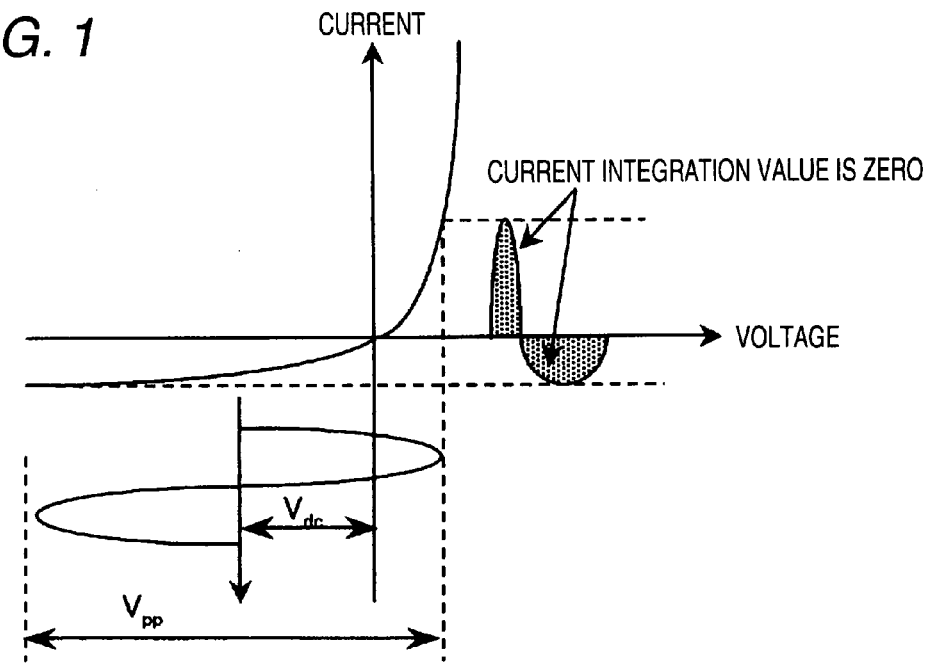
FIG. 1 illustrates the principle of the amorphyzation apparatus according to the present invention.

1: Vacuum container
2: Gas supply apparatus
3: Turbomolecular pump
4: Pressure regulating valve
5: High-frequency power source
6: Sample electrode
7: Dielectric window
8: Coil
9: Wafer
10: High-frequency power source
11: Gas inlet
12: Exhaust hole

BEST MODE FOR CARRYING OUT THE INVENTION

Embodiments of the present invention will be hereinafter described. Before doing so, the principle of the invention will be described in detail with reference to the drawings.

In the plasma processing method according to the invention, plasma is applied to the surface of a sample while being adjusted so that the thickness of an ion sheath is made uniform on the surface of the sample. The workings of this configuration will be described below in detail.

As described above, when a conductor having a potential $V_P$ is inserted in plasma having a plasma potential $V_S$, a negative electric field is formed around the conductor if $V_P<V_S$. Since ions are attracted and electrons are repelled, a condition (ion concentration)>(electron concentration) is established and a charge layer consisting of only ions is formed. Conversely, if $V_P>V_S$, a charge layer consisting of only electrons is formed.

On the other hand, when an insulator, instead of a conductor, is inserted in plasma, the number of electrons that come flying per unit time should be equal to that of ions that come flying per unit time because no DC current flows between the insulator and the plasma. However, since in general the speeds of electrons are much higher than those of ions, more electrons reach the surface of the insulator than ions. Therefore, excess electrons on the surface form a negative electric field in the vicinity of the surface and charging progresses until the electron current and the ion current become identical. A floating potential (negative potential) occurs in this manner, and in this case an ion sheath is formed on the surface.

A sheath voltage drop $V_{SH}$ can be increased (controlled) by applying high-frequency power to the electrode. FIG. 1 shows an exemplary current-voltage characteristic of the electrode (or substrate surface). As seen from FIG. 1, since the mobility of electrons is much higher than that of ions, a large electron current flows in if the application voltage is positive whereas a small ion current flows in if the application voltage is negative. Since the electrode (or substrate surface) is in a floating state in a DC sense, a steady state is established when the net current (the DC component of the current) becomes zero. Therefore, the electrode (or substrate surface) is self-biased at a negative potential. If the high-frequency power applied to the electrode is increased, the self-bias voltage $V_{DC}$ and the difference $V_{PP}$ between the instantaneous maximum and minimum values of the high-frequency voltage are increased.

Figure 2:
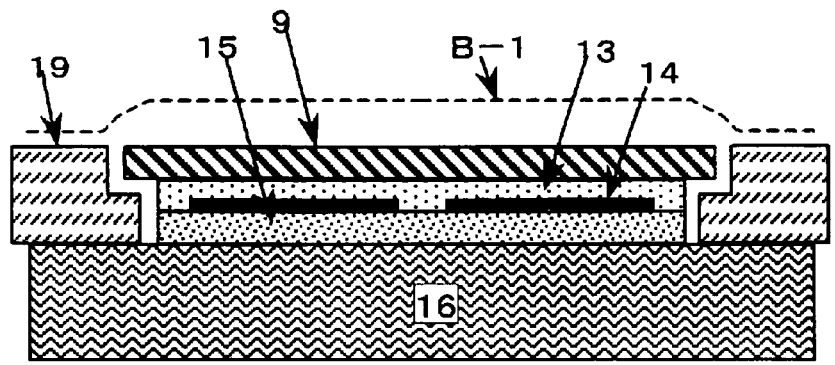
FIG. 2 illustrates the principle of the amorphyzation apparatus according to the invention.
Figure 8:
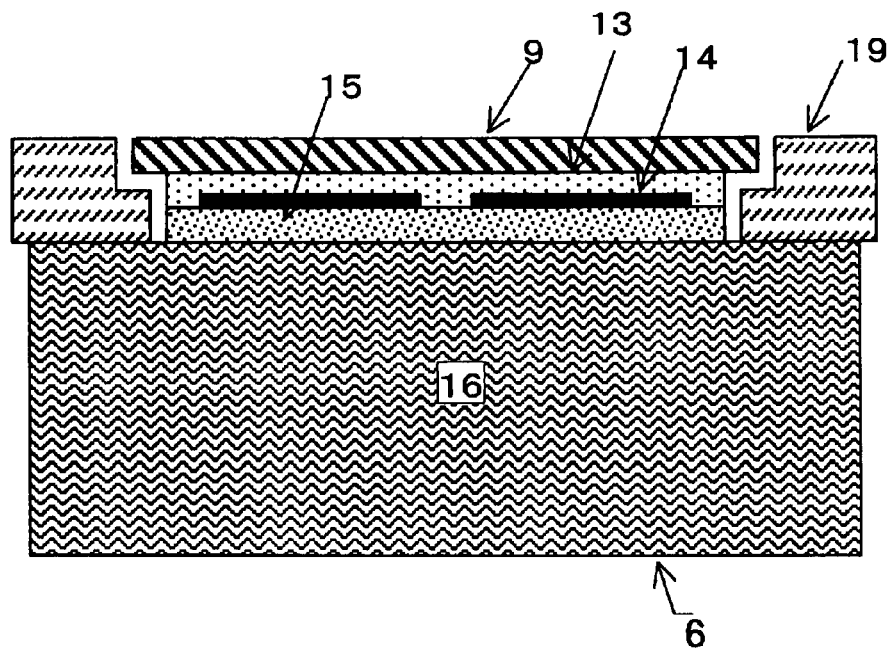
FIG. 8 is a detailed sectional view of another sample electrode according to the first embodiment of the invention.

FIG. 2 shows a sheath formed in the vicinity of a substrate in the case where no dielectric ring is provided (corresponds to FIG. 8). Symbol B-1 denotes the boundary between an ion sheath and bulk plasma. A high-frequency voltage is applied to a substrate 9 from a pedestal 16 via a second dielectric layer 15, an electrostatic chuck electrode 14, and a first dielectric layer 13. Therefore, a high-frequency current flows between the substrate 9 and the plasma. On the other hand, a high-frequency current also flows between the pedestal 16 and the plasma via a dielectric ring 19 (in general, the dielectric ring 19 is made of quartz glass having relative permittivity of about 4 and its capacitance per unit area is very small because its thickness is approximately equal to the sum of the thicknesses of the first dielectric layer 13 and the second dielectric layer 15).

In general, the first and second dielectric layers for electrostatic absorption are made of ceramics and their relative permittivity is larger than 4 and is typically in a range of 8 to 12. Where the surface of the substrate 9 is the same in height as the surface of the dielectric ring 19, the thickness of the dielectric ring 19 is greater than the sum of the thicknesses of the first dielectric layer 13 and the second dielectric layer 15 by the thickness of the substrate 9. It is understood from the above discussion that the capacitance per unit area between the substrate 9 and the pedestal 16 is larger than that between the plasma and the pedestal 16 via the dielectric ring 19.

As a result, the current per unit area flowing between the plasma and the substrate 9 is much larger than that flowing between the plasma and the pedestal via the dielectric ring 19. Therefore, as shown in FIG. 2, the ion sheath has a great thickness and hence causes a large voltage drop in the area corresponding to the portion of the substrate 9 excluding its peripheral portion.

It is seen from FIG. 2 that the boundary B-1 between the ion sheath and the bulk plasma is closer in the area corresponding to the peripheral portion of the substrate 9 than in the area corresponding to its central portion. The potential of the substrate 9 in the central portion is the same as in the peripheral portion. It is therefore concluded that the electric field strength in the ion sheath is much higher in the area corresponding to the peripheral portion of the substrate 9 than in the area corresponding to its central portion. We think that this leads to the phenomenon that the energy of ions impinging on the peripheral portion of the substrate 9 is higher than that impinging on its central portion, which in turn produces the result that the pre-amorphyzation processing rate in the peripheral portion of the substrate 9 is higher than in its central portion.

Figure 3:
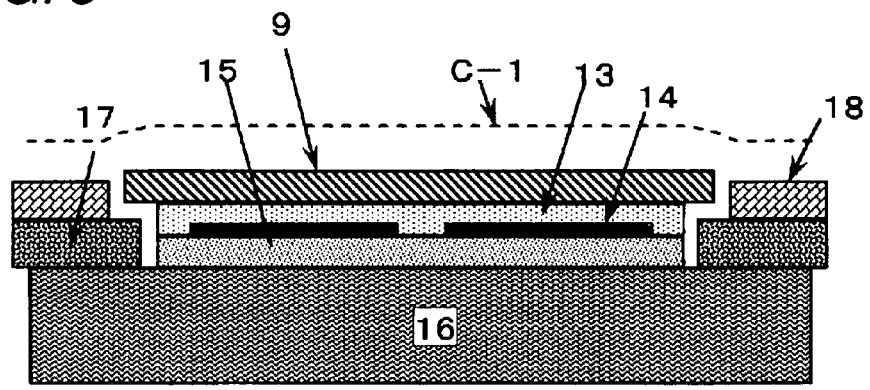
FIG. 3 illustrates the principle of the amorphyzation apparatus according to the invention.

In the invention, the difference in ion sheath thickness between the area corresponding to the substrate central portion and the area corresponding to the substrate peripheral portion is made smaller as seen from a boundary C-1 between an ion sheath and bulk plasma shown in FIG. 3. FIG. 3 corresponds to a case that the capacitance per unit area between the substrate 9 and the pedestal 16 is a little larger than that between the plasma and the pedestal 16 via the dielectric ring 19.

Figure 4:
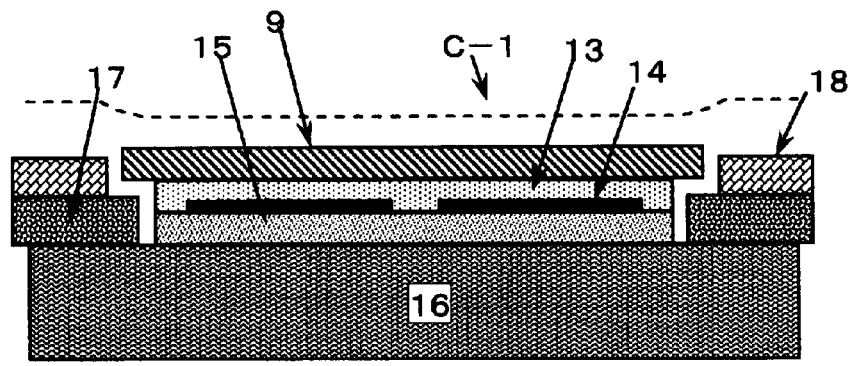
FIG. 4 illustrates the principle of the amorphyzation apparatus according to the invention.

On the other hand, FIG. 4 corresponds to a case that the capacitance per unit area between the substrate 9 and the pedestal 16 is a little smaller than that between the plasma and the pedestal 16 via the dielectric ring 19.

As described above, we empirically found that setting small the difference between the capacitance per unit area between the substrate 9 and the pedestal 16 and that between the plasma and the pedestal 16 via the dielectric ring 19 is important in increasing the uniformity of pre-amorphyzation processing, and also succeeded in proposing a proper model therefor.

As described above, the focus ring used in the invention is entirely different in the effect of introduction from that used in the dry etching technology though they have similarities in structure. The pre-amorphyzation processing is performed by causing inert gas ions (having almost no chemical reactivity) in plasma to collide with the substrate surface. The elements constituting the substrate are hardly volatilized and chemical reactions such as etching seldom occur (amorphyzation of a substrate surface layer occurs). The plasma doping processing is performed by causing ions of B, for example, in plasma (which have almost no chemical reactivity with silicon) to collide with the substrate surface. The elements constituting the substrate are hardly volatilized and chemical reactions such as etching seldom occur (B ions remain in the substrate). Each of the above kinds of processing is a physical phenomenon and is not a chemical-reaction-dominated phenomenon such as dry etching.

To make such a physical-phenomenon-dominated processing uniform, the invention uses the focus ring (dielectric ring) or the like to decrease an otherwise excessive ion concentration in the area corresponding to the substrate peripheral portion or equalize the thickness of an ion sheath in the area corresponding to the substrate peripheral portion to that in the area corresponding to the other portion of the substrate. As such, the conductor ring, the focus ring, etc. used in the invention are very different in purposes and effects from the focus ring etc. used in the conventional dry etching technology.

In contrast, in the dry etching technology, what is called a loading effect occurs and the etching rate tends to be high in the substrate peripheral portion. In the vicinity of the substrate peripheral portion, the concentrations of etching reaction products are lower than in the vicinity of the other portion of the substrate and, as a result, the concentration of the etchant (an etching reaction species as typified by a reactive halogen radical) is higher than in the vicinity of the other portion of the substrate (loading effect). This is the reason why the etching rate is high in the substrate peripheral portion. The focus ring is used conventionally to prevent this phenomenon. When the focus ring is introduced, etching reaction products generated from the substrate peripheral portion are rendered apt to stay in the vicinity of the substrate peripheral portion, whereby the concentrations of the etching reaction products in the vicinity of the substrate peripheral portion become approximately equal to those in the vicinity of the other portion of the substrate. Therefore, the etchant concentration in the vicinity of the substrate peripheral portion become approximately equal to that in the vicinity of the other portion of the substrate, which provides an advantage that and the etching rate distribution is made uniform.

As described above, the focus ring used in the dry etching technology is intended to provide a uniform reactive particle concentration distribution to make the chemical-reaction-dominated etching reaction uniform, and hence is entirely different in workings and advantages.

Embodiment 1

A first embodiment of the invention will be described below with reference to FIGS. 5-8.

This embodiment is characterized in that amorphyzation processing of applying plasma to regions, into which to introduce an impurity, of a surface layer of a single crystal silicon wafer as a sample before introduction of the impurity is performed in a state that a conductor ring is disposed so as to surround the outer perimeter of the wafer.

Figure 5:
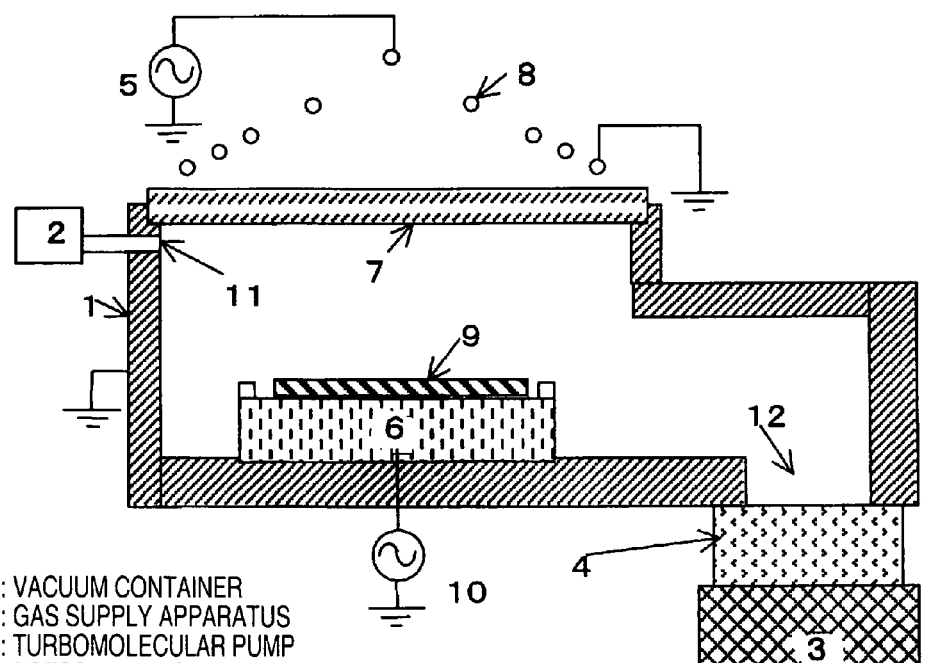
FIG. 5 is a sectional view showing the configuration of an amorphyzation apparatus used in a first embodiment of the invention.

FIG. 5 is a sectional view of an amorphyzation apparatus used in an amorphyzing method according to the first embodiment of the invention. As shown in FIG. 5, the amorphyzation apparatus is composed of a vacuum container 1, a turbomolecular pump 3 as an exhaust apparatus for exhausting the vacuum container 1, a pressure regulating valve 4 for controlling the pressure in the vacuum container 1, a coil 8 as a plasma source disposed close to a dielectric window 7 which is opposed to a sample electrode 6, a high-frequency power source 5 for supplying high-frequency electric power of 13.56 MHz to the coil 8, and a high-frequency power source 10 as a voltage source for supplying a voltage to the sample electrode 6. Reference numerals 11 and 12 denote a gas inlet and an exhaust hole, respectively.

As shown in FIG. 5, a prescribed gas is introduced into the vacuum container 1 from the gas supply apparatus 2 while being exhausted by the turbomolecular pump 3 as the exhaust apparatus. The pressure in the vacuum container 1 can be kept at a prescribed value by the pressure regulating valve 4. High-frequency electric power of 13.56 MHz is supplied from the high-frequency power source 5 to the coil 8 disposed close to the dielectric window 7 which is opposed to the sample electrode 6, whereby induction-coupled plasma can be generated in the vacuum container 1. The high-frequency power source 10 for supplying high-frequency electric power to the sample electrode 6 is provided which functions as a voltage source for controlling the potential of the sample electrode 6 so that the potential of a wafer 9 as a sample becomes negative with respect to that of plasma. A gas that is supplied from the gas supply apparatus 2 is introduced into the vacuum container 1 through the gas inlet 11, and the gas in the vacuum container 1 is exhausted into the pump 3 through the exhaust hole 11.

Figure 6:
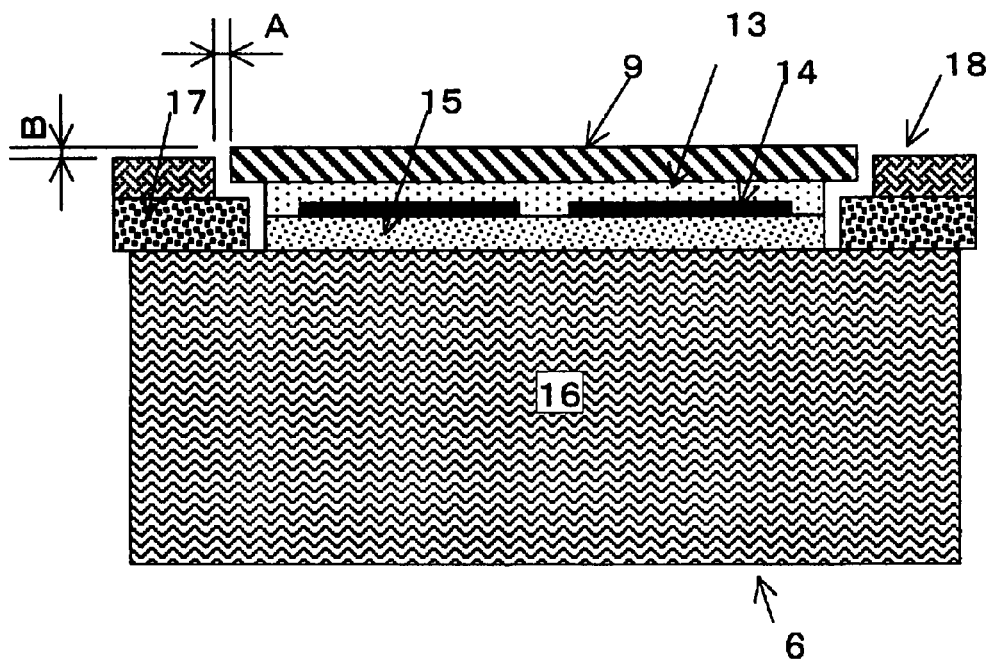
FIG. 6 is a detailed sectional view of a sample electrode according to the first embodiment of the invention.

FIG. 6 is an enlarged, detailed sectional view of a part in which the silicon wafer 9 is mounted on the sample electrode 6. As shown in FIG. 6, the sample electrode 6 has a layered structure in which a first dielectric layer 13, an electrostatic chuck electrode 14, a second dielectric layer 15, and a pedestal 16 are arranged in this order from the side that is closer to the silicon wafer 9 as the sample. The first dielectric layer 13, the electrostatic chuck electrode 14, and the second dielectric layer 15 project from the pedestal 16. A third dielectric layer 17 and a conductor ring 18, which have ring shapes, are disposed around the projecting portion. The third dielectric layer 17 is interposed between the conductor ring 18 and the pedestal 16. The conductor ring 18 is disposed outside the outer perimeter of the silicon wafer 9 as the sample, and the surface of the conductor ring 18 is approximately flush with the surface of the silicon wafer 9. A DC voltage is applied to the electrostatic chuck electrode 14, whereby the silicon wafer 9 is absorbed on the surface of the first dielectric layer 13 which is the surface of the projecting portion of the sample electrode 6, whereby the temperature of the silicon wafer 9 can be controlled precisely.

Prior to amorphyzation processing, gate electrodes are formed on the surface of a silicon wafer as a sample. More specifically, gate electrode patterns are formed by forming a silicon oxide film as a gate oxide film on the surface of a single crystal silicon wafer, forming a conductive layer for formation of gate electrodes on the silicon oxide film by CVD or the like, and patterning the conductive layer.

After the silicon wafer 9 on which the gate electrodes have been formed in the above manner is mounted on the sample electrode 6, a helium gas is supplied at 50 sccm to the inside of the vacuum container 1 through the gas inlet 11 while the vacuum container 1 is exhausted through the exhaust hole 12 and the temperature of the sample electrode 6 is kept at 25° C. The pressure in the vacuum container 1 is kept at 1 Pa by controlling the pressure regulating valve 4.

Then, plasma is generated in the vacuum container 1 by supplying high-frequency power of 800 W to the coil 8 as the plasma source and high-frequency power of 200 W is supplied to the pedestal 16 of the sample electrode 6. In this manner, a surface crystal layer of the silicon wafer 9 was rendered amorphous successfully.

Figure 7:
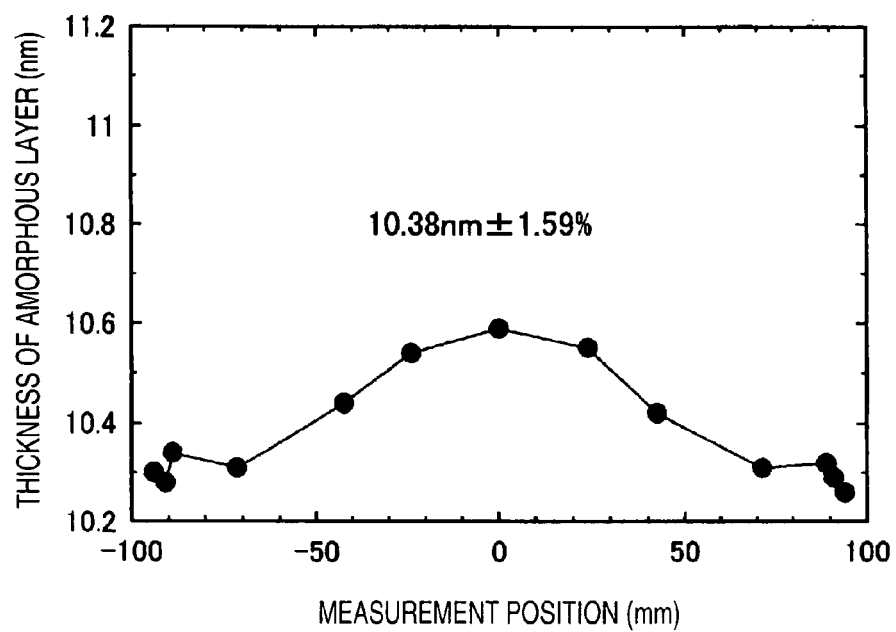
FIG. 7 is a graph showing a measurement result of the thickness of an amorphous layer in the first embodiment of the invention.

FIG. 7 shows a result of a measurement of the thickness of an amorphous layer produced by amorphyzing a 200-mm-diameter silicon wafer. The x-axis is taken in the left-to-right direction in FIG. 5 or 6. As seen from FIG. 7, the thickness of the amorphous layer does not have eminent peaks in portions close to the outer perimeter and the uniformity is increased greatly to as high as ±1.59%. When an amorphyzation apparatus having a conventional configuration without a conductor ring was used, the thickness variation of an amorphous layer with respect to the measurement position was ±3.26%. This improvement is considered due to that the distortion of equipotential lines of the sheath layer in the area corresponding to the portion, close to the outer perimeter, of the wafer 9 is reduced and the incidence energy of ions incident on the wafer 9 is thereby made uniform in the entire area including the area corresponding to the portion, close to the outer perimeter, of the wafer 9.

The capacitance Ca per unit area between the wafer 9 and the pedestal 16 is given by $Ca=1/(d1/\in 1+d2/\in 2)$ and the capacitance Cb per unit area between the conductor ring 18 and the pedestal 16 is given by $Cb=\in 3/d3$, where $\in 1$ and d1 are the relative permittivity and the thickness of the first dielectric layer 13, $\in 2$ and d2 are the relative permittivity and the thickness of the second dielectric layer 15, and $\in 3$ and d3 are the relative permittivity and the thickness of the third dielectric layer 17. In the embodiment, the relative permittivities and the thicknesses of the respective electric layers are set so as to establish a relationship Ca=1.2Cb. As in this example, it is desirable that the capacitances Ca and Cb per unit area be set approximately identical. If the capacitances Ca and Cb have a large difference, the high-frequency impedance per unit area corresponding to the larger one of Ca and Cb is small and the current densities (ion currents per unit area) of ion currents flowing into the wafer 9 and the conductor ring 18 have a large difference, which is a factor in lowering the uniformity of amorphyzation processing. In our experiments, high in-plane uniformity was secured when Ca was larger than or equal to 0.5 times Cb and smaller than or equal to 2 times Cb.

For comparison, a similar experiment was conducted with a structure that a dielectric ring 19 was disposed around a wafer 9 but no conductor ring is provided (see FIG. 8). As in the conventional example, an amorphous layer was extremely thick in the portion close to the outer perimeter of the wafer and the uniformity was ±3.31%.

Although in the embodiment the distance A between the outer perimeter of the wafer 9 and the inner perimeter of the conductor ring 18 is set at 1.5 mm, it is desirable that the distance A be set in a range of 1 mm to 10 mm. If the distance A is shorter than 1 mm, the wafer 9 may run onto the conductor ring 18 due to a transport error occurring in its transport. That is, the distance A being shorter than 1 mm is not preferable because of an insufficient transport margin. If the distance A is longer than 10 mm, an amorphous layer may become extremely thick in the portion, close to the outer perimeter, of the wafer 9. The distance A being longer than 10 mm is thus not preferable. Usually, the diameter (typical length) of the wafer 9 is designed so as to be longer than the diameter (typical length) of the projecting portion of the sample electrode 6 by about 1 mm. Therefore, it is desirable that the distance between the outer perimeter of the projecting portion of the sample electrode 6 and the inner perimeter of the conductor ring 18 be set in a range of 2 mm to 11 mm.

Although in the embodiment the difference B in height between the surface of the wafer 9 and the conductor ring 18 is set at 0.3 mm, it is desirable that the difference B be set in a range of 0.001 mm to 1 mm. Setting the difference B at 0.001 mm is difficult in design. If the difference B is larger than 1 mm, an amorphous layer may become extremely thin or thick in the portion, close to the outer perimeter, of the wafer 9. Therefore, the difference B being larger than 1 mm is not preferable. Since the thickness of the wafer 9 is about 1 mm, it is desirable that the difference in height between the surface of the projecting portion of the sample electrode 6 and the surface of the conductor ring 18 be in a range of 0.001 mm to 2 mm.

Embodiment 2

Next, a second embodiment of the invention will be described.

This embodiment employs the same amorphyzation apparatus as the first embodiment does except that a high-frequency voltage for controlling the ion energy is applied to the electrostatic chuck electrode 14 rather than the pedestal 16 (see FIG. 8). Also in this case, we confirmed that the uniformity of processing was increased.

The capacitance between the electrostatic chuck electrode and the sample is given by $(\in 1 \times S1)/d1$ and the capacitance between the electrostatic chuck electrode and the conductor ring is given by $1/\{d2/(\in 2 \times S1)+d3/(\in 3 \times S2)\}$, where $\in 1$ and d1 are the relative permittivity and the thickness of the first dielectric layer, $\in 2$ and d2 are the relative permittivity and the thickness of the second dielectric layer, $\in 3$ and d3 are the relative permittivity and the thickness of the third dielectric layer, S1 is the area of the electrostatic chuck electrode, and S2 is the surface area of the conductor ring.

Therefore, the ratio between the RF current flowing into the sample and the RF current flowing into the conductor ring is $(\in 1 \times S1)/d1:1/\{d2/(\in 2 \times S1)+d3/(\in 3 \times S2)\}$.

By dividing the above formulae by S1 and S2, respectively, the ratio between the RF currents per unit area is obtained as $\in 1/d1:1/\{(d2 \times S2)/(\in 2 \times S1)+d3/\in 3\}$.

In the embodiment, the relative permittivities and the thicknesses of the respective electric layers are set so as to establish a relationship Cc=1.1Cd. If the capacitances Cc and Cd have a large difference, the high-frequency impedance per unit area corresponding to the larger one of Cc and Cd is small and the current densities (ion currents per unit area) of ion currents flowing into the wafer and the conductor ring have a large difference, which is a factor in lowering the uniformity of amorphyzation processing. In our experiments, high in-plane uniformity was secured when Cc was larger than or equal to 0.5 times Cd and smaller than or equal to 2 times Cd.

Embodiment 3

Next, a third embodiment of the invention will be described with reference to FIG. 9.

Figure 9:
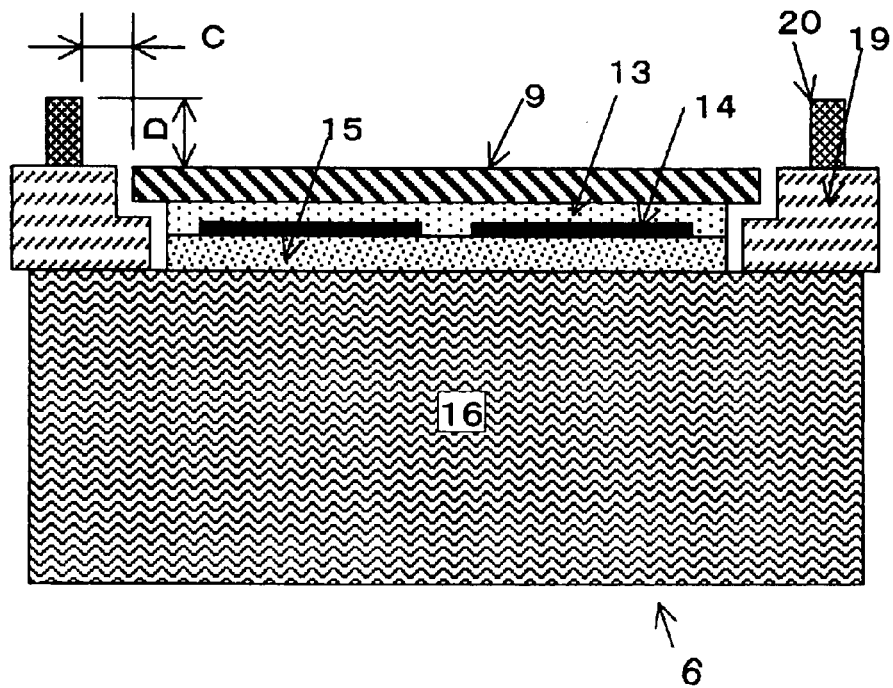
FIG. 9 is a detailed sectional view of a sample electrode according to a third embodiment of the invention.

This embodiment employs the same amorphyzation apparatus as the first embodiment does except that the structure of the sample electrode 6 is as shown in a detailed sectional view of FIG. 9. As shown in FIG. 9, the sample electrode 6 has a layered structure in which a first dielectric layer 13, an electrostatic chuck electrode 14, a second dielectric layer 15, and a pedestal 16 are arranged in this order from the side that is closer to a silicon wafer 9 as a sample. The first dielectric layer 13, the electrostatic chuck electrode 14, and the second dielectric layer 15 project from the pedestal 16. A dielectric ring 19 is disposed around the projecting portion, and a focus ring 20 made of a dielectric is disposed on the dielectric ring 19. The distance C between the outer perimeter of the wafer 9 and the inner perimeter of the focus ring is set at 6 mm. The focus ring 20 is disposed outside the outer perimeter of the wafer 9 as the sample, and the surface of the focus ring 20 is higher than the surface of the wafer 9 by 7 mm. That is, the difference D in height between the surface of the wafer 9 as the sample and the surface of the focus ring 20 is equal to 7 mm. A DC voltage is applied to the electrostatic chuck electrode 14 to control the temperature of the wafer precisely by the silicon wafer 9 by causing it to be absorbed on the surface of the first dielectric layer 13 which is the surface of the projecting portion of the sample electrode 6.

After a wafer 9 is mounted on the sample electrode 6, a helium gas is supplied at 50 sccm to the inside of the vacuum container 1 through the gas inlet 11 while the vacuum container 1 is exhausted through the exhaust hole 12 and the temperature of the sample electrode 6 is kept at 25° C. The pressure in the vacuum container 1 is kept at 1 Pa by controlling the pressure regulating valve 4. Then, plasma is generated in the vacuum container 1 by supplying high-frequency power of 800 W to the coil 8 as the plasma source and high-frequency power of 200 W is supplied to the pedestal 16 of the sample electrode 6. In this manner, a surface crystal layer of the silicon wafer 9 was rendered amorphous uniformly.

The result that the amorphous layer is not extremely thick in the portion, close to the outer perimeter, of the wafer and the uniformity is increased greatly is considered due to that the distortion of equipotential lines of the sheath layer in the area corresponding to the portion, close to the outer perimeter, of the wafer 9 is reduced and the incidence energy of ions incident on the wafer 9 is thereby made uniform in the entire area including the area corresponding to the portion, close to the outer perimeter, of the wafer 9.

It is desirable that the distance C between the outer perimeter of the wafer 9 as the sample and the inner perimeter of the focus ring 20 be set in a range of 1 mm to 10 mm. If the distance C is shorter than 1 mm, an amorphous layer may become too thin in the area corresponding to the portion, close to the outer perimeter, of the wafer 9. That is, the distance C being shorter than 1 mm is not preferable. Conversely, if the distance C is longer than 10 mm, an amorphous layer may become extremely thick in the portion, close to the outer perimeter, of the wafer 9. The distance C being longer than 10 mm is thus not preferable. Usually, the diameter (typical length) of the wafer 9 is designed so as to be longer than the diameter (typical length) of the projecting portion of the sample electrode 6 by about 1 mm. Therefore, it is desirable that the distance between the outer perimeter of the projecting portion of the sample electrode 6 and the inner perimeter of the focus ring 20 be set in a range of 2 mm to 11 mm.

It is desirable that the difference D in height between the surface of the wafer 9 as the sample and the surface of the focus ring 20 be set in a range of 1 mm to 15 mm. If the difference D is shorter than 1 mm, an amorphous layer may become extremely thick in the portion, close to the outer perimeter, of the wafer 9. That is, the difference D being shorter than 1 mm is not preferable. Conversely, if the difference D is larger than 15 mm, an amorphous layer may become too thin in the portion, close to the outer perimeter, of the wafer 9. Therefore, the difference D being larger than 1 mm is not preferable. Since the thickness of the wafer 9 is about 1 mm, it is desirable that the difference in height between the surface of the projecting portion of the sample electrode 6 and the surface of the focus ring 20 be in a range of 2 mm to 16 mm.

Embodiment 4

Next, a fourth embodiment of the invention will be described with reference to FIG. 10.

This embodiment is characterized in that a silicon tray 21 having a recess that conforms to the outward shape of a silicon wafer 9 as a sample is disposed on the sample electrode 6, and that the tray 21 has a ring-shaped surface which is approximately the same in height as the surface of the silicon wafer 9.

Figure 10:
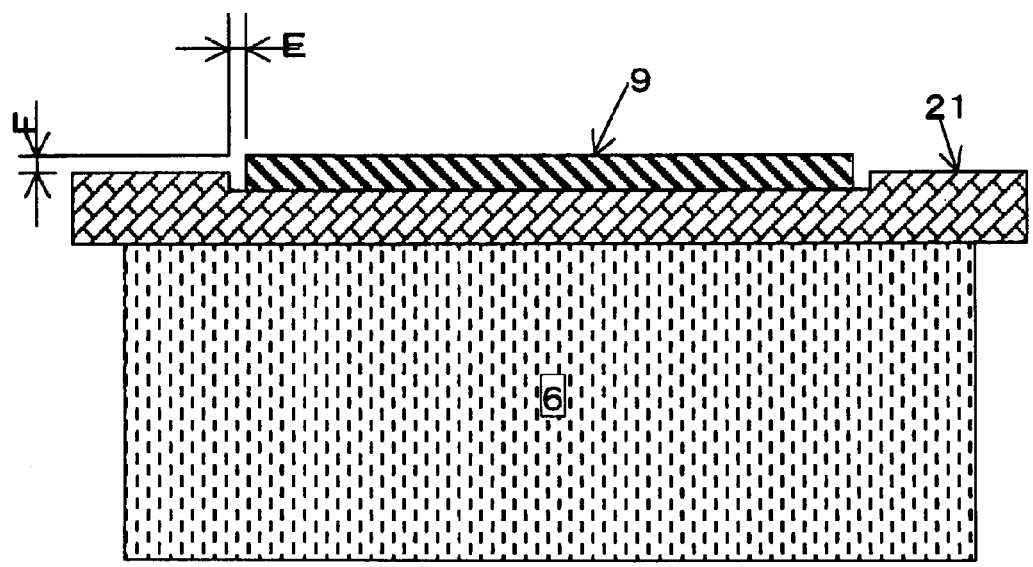
FIG. 10 is a detailed sectional view of a sample electrode according to a fourth embodiment of the invention.

This embodiment employs the same amorphyzation apparatus as the first embodiment does except that the structure of the sample electrode 6 is as shown in a detailed sectional view of FIG. 10. As shown in FIG. 10, a wafer 9 mounted on the silicon tray 21 is placed on the sample electrode 6. The tray 21 may always be placed on the sample electrode 6. An alternative procedure is that a wafer 9 is mounted on the tray 21 in the air and the tray 21 is then transported to the sample electrode 6.

The former procedure is advantageous in that the configuration of the transport system is simple. The latter procedure is advantageous in that it is not necessary to expose the vacuum container 1 to the air in replacing the tray 21 when it is worn. The tray 21 is formed with the step so that a sample occupies an inside space of the tray 21. The surface of the portion, outside the step, of the tray 21 is set approximately the same in height as the surface of a sample.

After the tray 21 mounted with a wafer 9 is placed on the sample electrode 6, a helium gas is supplied at 50 sccm to the inside of the vacuum container 1 through the gas inlet 11 while the vacuum container 1 is exhausted through the exhaust hole 12 and the temperature of the sample electrode 6 is kept at 15° C. The pressure in the vacuum container 1 is kept at 1 Pa by controlling the pressure regulating valve 4. Then, plasma is generated in the vacuum container 1 by supplying high-frequency power of 800 W to the coil 8 as the plasma source and high-frequency power of 200 W is supplied to the sample electrode 6. In this manner, a surface crystal layer of the silicon wafer 9 was rendered amorphous uniformly.

The result that the amorphous layer is not extremely thick in the portion, close to the outer perimeter, of the wafer and the uniformity is increased is considered due to that the distortion of equipotential lines of the sheath layer in the area corresponding to the portion, close to the outer perimeter, of the wafer 9 is reduced and the incidence energy of ions incident on the wafer 9 is thereby made uniform in the entire area including the area corresponding to the portion, close to the outer perimeter, of the wafer 9.

Although in the embodiment the distance E between the outer perimeter of the wafer 9 as the sample and the step is set at 1 mm, it is desirable that the distance E be set in a range of 1 mm to 10 mm. If the distance E is shorter than 1 mm, the wafer 9 may run onto the portion, outside the step, of the tray 21 due to a transport error occurring in its transport. That is, the distance E being shorter than 1 mm is not preferable because of an insufficient transport margin. If the distance E is longer than 10 mm, an amorphous layer may become extremely thick in the portion, close to the outer perimeter, of the wafer 9. The distance E being longer than 10 mm is thus not preferable.

Although in the embodiment the difference F in height between the surface of the wafer 9 as the sample and the surface of the portion, outside the step, of the tray 21 is set at 0.4 mm, it is desirable that the difference F be set in a range of 0.001 mm to 1 mm. Setting the difference Fat 0.001 mm is difficult in design. If the difference F is larger than 1 mm, an amorphous layer may become extremely thin or thick in the portion, close to the outer perimeter, of the wafer 9. Therefore, the difference F being larger than 1 mm is not preferable.

In the embodiment, the sample is a silicon wafer and the tray is made of silicon. This combination can minimize the substrate pollution.

Figure 11:
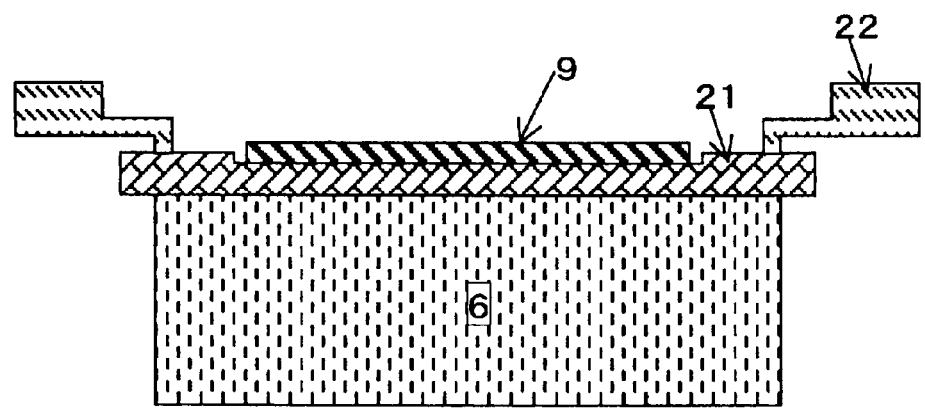
FIG. 11 is a detailed sectional view of another sample electrode according to the fourth embodiment of the invention.
Figure 12:
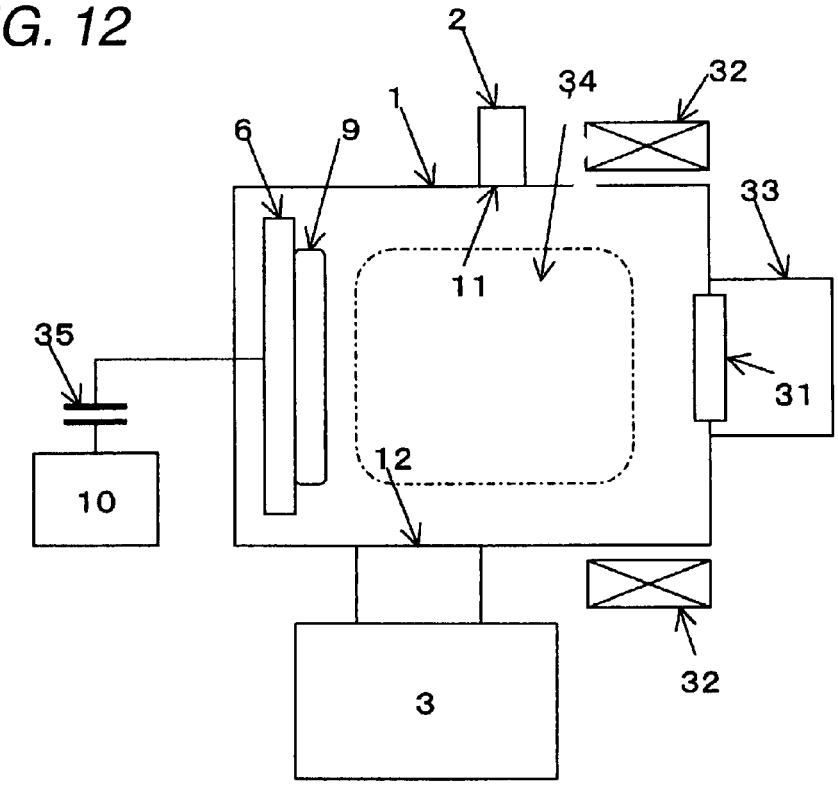
FIG. 12 is a sectional view showing the configuration of a plasma doping apparatus used in a conventional example.
Figure 13:
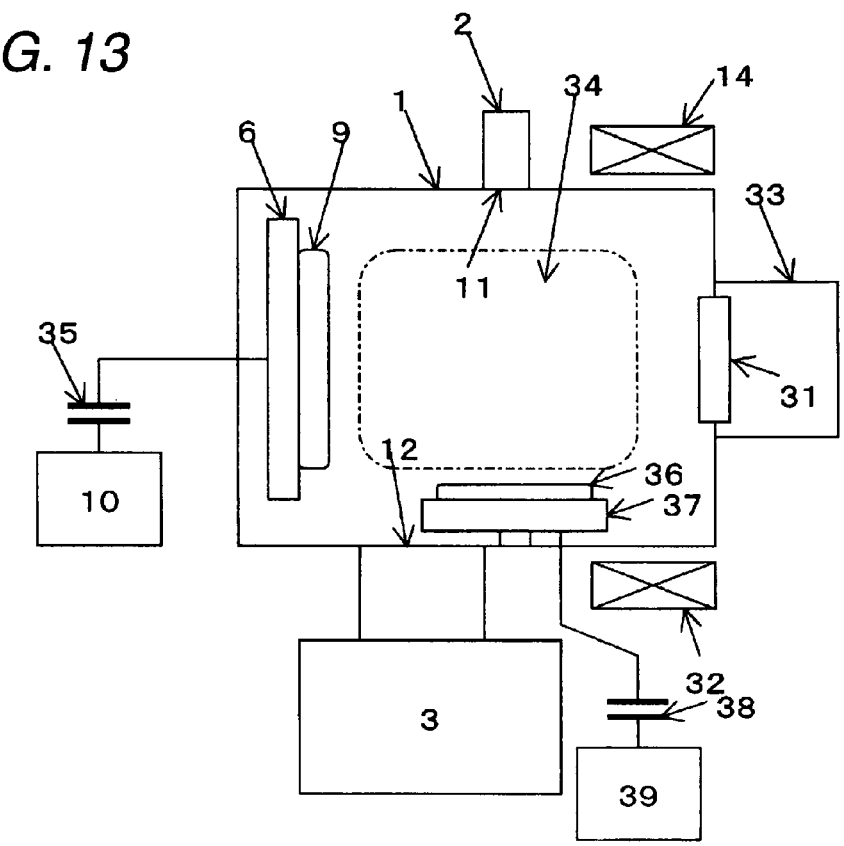
FIG. 13 is a sectional view showing the configuration of a plasma doping apparatus used in another conventional example.
Figure 14:
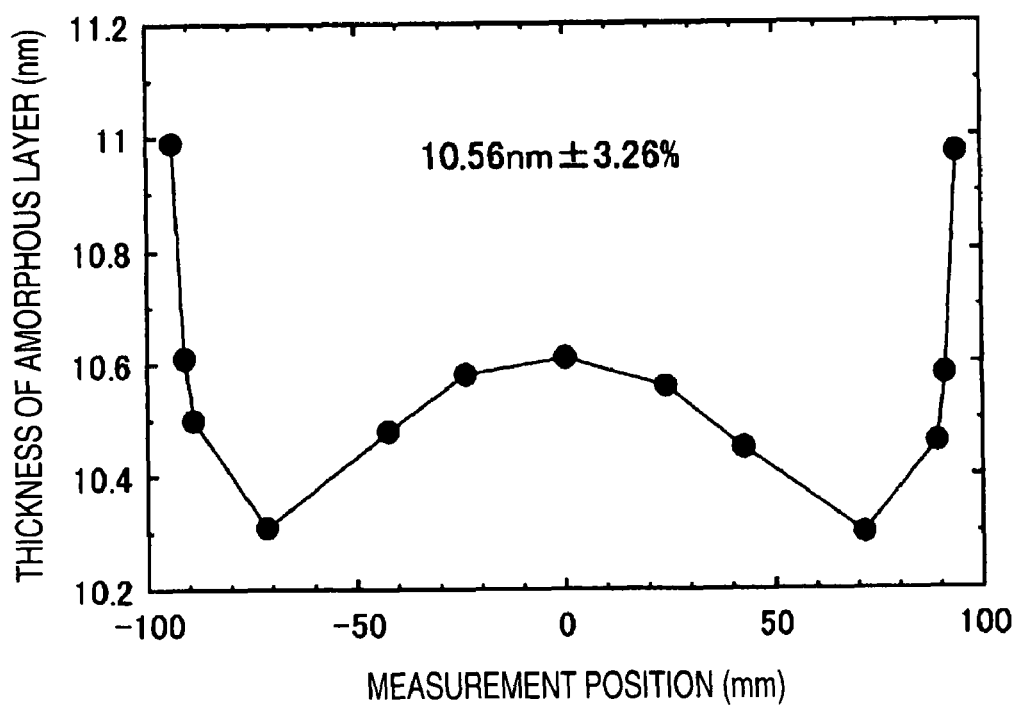
FIG. 14 is a graph showing a measurement result of the thickness of an amorphous layer in a conventional example.

As in a modification shown in FIG. 11, amorphyzation may be performed in a state that the tray 21 is pressed against the sample electrode by a clamp ring 22. This structure increases the heat conduction between the tray 21 and the sample electrode 6 and thereby makes it possible to control the temperature of the wafer 9 more precisely.

A manufacturing step of generating plasma and a manufacturing step in which the plasma generation is suspended and the pressure in the vacuum container is set higher than in the step of generating plasma may be executed alternately and repeatedly. With this process, heat that has been stored in a wafer 9 in the step of generating plasma is allowed to escape to the sample electrode 6 side through heat transmission by a gas that flows into the interstices between the wafer 9 and the tray 21 and those between the tray 21 and the sample electrode 6 in the step in which the plasma generation is suspended and the pressure in the vacuum container is set higher than in the step of generating plasma. This in turn makes it possible to control the temperature of the wafer 9 more precisely.

In the above case, it is preferable that the pressure in the vacuum container in the step in which the plasma generation is suspended and the pressure in the vacuum container is set higher than in the step of generating plasma be set in a range of 100 Pa to 1,000 Pa. If the pressure is lower than 100 Pa, the effect of allowing heat to escape is small and too much time is taken to lower the temperature of the wafer 9. Conversely, if the pressure is higher than 1,000 Pa, too much time is taken to increase or decrease the pressure.

As for the shape of the vacuum container, the type and the manner of disposition of the plasma source, etc. in the application ranges of the invention, only part of various variations have been described in the above-described embodiments of the invention. It goes without saying that various variations other than the above-described ones are possible in applying the invention.

For example, the coil 8 may be a planar one. Alternatively, a helicon wave plasma source, a magnetically neutral loop plasma source, or a magnetic field microwave plasma source (electron cyclotron resonance plasma source) may be used. A parallel-plate plasma source may also be used.

An inert gas other than helium may be used; that is, a gas of one of neon, argon, krypton, and xenon may be used. These inert gases are advantageous in that adverse effects on a sample are smaller than of other gases.

Although the embodiments are directed to the case that the sample is a single crystal silicon wafer, the invention can also be applied to cases of processing samples made of other various materials such as a polysilicon wafer or a compound semiconductor wafer (e.g., GaAs wafer).

INDUSTRIAL APPLICABILITY

Capable of increasing the uniformity of amorphyzation processing, the amorphyzing method and apparatus according to the invention can be applied to various uses such as semiconductor impurity doping processes, manufacture of thin-film transistors that are used in liquid crystal devices etc., and surface reforming of various materials.

The invention claimed is:

1. A plasma processing method, comprising the steps of:
mounting a sample on a sample electrode disposed in a vacuum container, exhausting the vacuum container while supplying a source gas to inside the vacuum container, and generating plasma in the vacuum container by supplying high-frequency power to a plasma source; and applying plasma to a surface of the sample while being adjusted so that thickness of an ion sheath is made uniform on the surface of the sample, in a state that a conductor ring is disposed so as to surround an outer perimeter of the sample.

2. The plasma processing method according to claim 1, wherein the plasma is adjusted so as to amorphyze a surface layer of the sample.

3. The plasma processing method according to claim 1, wherein the plasma is adjusted so as to introduce an impurity into a surface layer of the sample.

4. The plasma processing method according to claim 1, wherein the conductor ring has a surface that is approximately the same in height as the surface of the sample.

5. The plasma processing method according to claim 4, wherein a distance between the outer perimeter of the sample and an inner perimeter of the conductor ring is in a range of 1 mm to 10 mm.

6. The plasma processing method according to claim 4, wherein a difference in height between the surface of the sample and a surface of the conductor ring is in a range of 0.001 mm to 1 mm.

7. The plasma processing method according to claim 4, wherein a voltage is applied to a pedestal in a state that the sample electrode has a layered structure in which a first dielectric layer, an electrostatic chuck electrode, a second dielectric layer, and the pedestal are arranged in this order from the side that is closer to the sample, that the first dielectric layer, the electrostatic chuck electrode, and the second dielectric layer project from the pedestal, and that a third dielectric layer is disposed between the conductor ring and the pedestal.

8. The plasma processing method according to claim 7, wherein $Ca = 1/(d1/\in1 + d2/\in2)$ is larger than or equal to 0.5 times $Cb = \in3/d3$ and smaller than or equal to 2 times Cb, where $\in1$ and d1 are relative permittivity and thickness of the first dielectric layer, $\in2$ and d2 are relative permittivity and thickness of the second dielectric layer, and $\in3$ and d3 are relative permittivity and thickness of the third dielectric layer.

9. The plasma processing method according to claim 4, wherein a voltage is applied to an electrostatic chuck electrode in a state that the sample electrode has a layered structure in which a first dielectric layer, the electrostatic chuck electrode, a second dielectric layer, and a pedestal are arranged in this order from the side that is closer to the sample, that the first dielectric layer, the electrostatic chuck electrode, and the second dielectric layer project from the pedestal, and that a third dielectric layer is disposed between the conductor ring and the pedestal.

10. The plasma processing method according to claim 9, wherein $Cc = \in1/d1$ is larger than or equal to 0.5 times $Cd = 1/\{(d2 \times S2)/(\in2 \times S1) + d3/\in3\}$ and smaller than or equal to 2 times Cd, where $\in1$ and d1 are relative permittivity and thickness of the first dielectric layer, $\in2$ and d2 are relative permittivity and thickness of the second dielectric layer, $\in3$ and d3 are relative permittivity and thickness of the third dielectric layer, S1 is an area of a surface, exposed to the plasma, of the sample, and S2 is an area of a surface, exposed to the plasma, of the conductor ring.

11. A plasma processing method, comprising the steps of:
mounting a sample on a sample electrode disposed in a vacuum container, exhausting the vacuum container while supplying a source gas to inside the vacuum container, and generating plasma in the vacuum container by supplying high-frequency power to a plasma source; and performing plasma processing while being adjusted so that thickness of an ion sheath is made uniform on the surface of the sample, in a state that a focus ring having a surface that is higher than the surface of the sample by 1 mm or more is disposed outside an outer perimeter of the sample.

12. The plasma processing method according to claim 11, wherein a distance between the outer perimeter of the sample and an inner perimeter of the focus ring is in a range of 1 mm to 10 mm.

13. The plasma processing method according to claim 11, wherein a difference in height between the surface of the sample and a surface of the focus ring is in a range of 1 mm to 15 mm.

14. A plasma processing method, comprising the steps of:
mounting a sample on a tray disposed in a vacuum container and having a step inside which the sample is mounted, exhausting the vacuum container while supplying a source gas to inside the vacuum container, and generating plasma in the vacuum container by supplying high-frequency power to a plasma source; and applying plasma to the surface of the sample while making an adjustment so that a surface of a portion outside the recess of the tray is approximately the same in height as the surface of the sample, and being adjusted so that thickness of an ion sheath is made uniform on the surface of the sample.

15. The plasma processing method according to claim 14, wherein a distance between the outer perimeter of the sample and the step is in a range of 1 mm to 10 mm.

16. The plasma processing method according to claim 14, wherein a difference in height between the surface of the sample and a surface of the portion, outside the step, of the tray is in a range of 0.001 mm to 1 mm.

17. The plasma processing method according to claim 14, wherein the sample is a silicon wafer and the tray is made of silicon.

18. The plasma processing method according to claim 14, wherein the plasma processing is performed in a state that the tray is pressed against the sample electrode.

19. The plasma processing method according to claim 14, wherein:
a step of generating plasma and a step of suspending the plasma generation are performed alternately and repeatedly; and pressure in the vacuum container is set higher in the step of suspending the plasma generation than in the step of generating plasma.

20. The plasma processing method according to. claim 19, wherein a difference between the pressure in the vacuum container in the step of suspending the plasma generation and that in the step of generating plasma is in a range of 100 Pa to 1,000 Pa.

21. A plasma processing apparatus comprising:
a vacuum container;
a sample electrode disposed in the vacuum container and to be mounted with a sample;
a gas supply apparatus for supplying a gas to inside the vacuum container;
an exhaust apparatus for exhausting the vacuum container;
a pressure control device for controlling pressure in the vacuum container;
a plasma source;
a high-frequency power source for supplying high-frequency power to the plasma source;
a voltage source for applying a voltage to the sample electrode; and
an auxiliary member disposed around the sample electrode so that plasma is applied to a surface of a sample while being adjusted so as to have a uniform energy state on the surface of the sample.

22. The plasma processing apparatus according to claim 21, wherein the plasma is adjusted so as to amorphyze a surface layer of the sample.

23. The plasma processing apparatus according to claim 21, wherein the plasma is adjusted so as to introduce an impurity into a surface layer of the sample.

24. The plasma processing apparatus according to claim 21, wherein:
the sample electrode has a projecting portion to be mounted with the sample; and
the auxiliary member is a conductor ring disposed so as to surround an outer perimeter of the sample and to have a surface that is approximately the same in height as the surface of the sample.

25. The plasma processing apparatus according to claim 24, wherein a distance between the outer perimeter of the sample and an inner perimeter of the conductor ring is in a range of 2 mm to 11 mm.

26. The plasma processing apparatus according to claim 24, wherein a difference in height between the surface of the sample and a surface of the conductor ring is in a range of 0.001 mm to 2 mm.

27. The plasma processing apparatus according to claim 21, wherein the sample electrode has a layered structure in which a first dielectric layer, an electrostatic chuck electrode, a second dielectric layer, and a pedestal are arranged in this order from the side that is closer to the sample, the first dielectric layer, the electrostatic chuck electrode, and the second dielectric layer project from the pedestal, and a third dielectric layer is disposed between the conductor ring and the pedestal; and wherein a voltage is applied to the pedestal.

28. The plasma processing apparatus according to claim 27, wherein $Ca=1/(d1/\in1 +d2/\in2)$ is larger than or equal to 0.5 times $Cb=\in3/d3$ and smaller than or equal to 2 times Cb, where $\in1$ and d1 are relative permittivity and thickness of the first dielectric layer, $\in2$ and d2 are relative permittivity and thickness of the second dielectric layer, and $\in3$ and d3 are relative permittivity and thickness of the third dielectric layer.

29. The plasma processing apparatus according to claim 21, wherein the sample electrode has a layered structure in which a first dielectric layer, an electrostatic chuck electrode, a second dielectric layer, and a pedestal are arranged in this order from the side that is closer to the sample, the first dielectric layer, the electrostatic chuck electrode, and the second dielectric layer project from the pedestal, and a third dielectric layer is disposed between the conductor ring and the pedestal; and wherein a voltage is applied to the electrostatic chuck electrode.

30. The plasma processing apparatus according to claim 29, wherein $Cc=\in1/d1$ is larger than or equal to 0.5 times $Cd=1/\{(d2\times S2)/(\in2\times S1) +d3/\in3\}$ and smaller than or equal to 2 times Cd, where $\in1$ and d1 are relative permittivity and thickness of the first dielectric layer, $\in2$ and d2 are relative permittivity and thickness of the second dielectric layer, $\epsilon_3$ and $d_3$ are relative permittivity and thickness of the third dielectric layer, S1 is an area of a surface, exposed to the plasma, of the sample, and S2 is an area of a surface, exposed to the plasma, of the conductor ring.

31. The plasma processing apparatus according to claim 21, wherein:

the sample electrode has a projecting portion to be mounted with the sample; and the auxiliary member is a focus ring disposed so as to surround the sample and to have a surface that is higher than the surface of the sample being mounted on the sample electrode by 1 mm or more.

32. The plasma processing apparatus according to claim 31, wherein a distance between the outer perimeter of the sample and an inner perimeter of the focus ring is in a range of 2 mm to 11 mm.

33. The plasma processing apparatus according to claim 30, wherein a difference in height between the surface of the sample and a surface of the focus ring is in a range of 2 mm to 16 mm.

* * * * *